United States Patent
Chung et al.

(10) Patent No.: US 6,580,093 B2
(45) Date of Patent: Jun. 17, 2003

(54) STRUCTURE OF A THIN FILM TRANSISTOR (TFT) ARRAY

(75) Inventors: Te-Cheng Chung, Tauyuan Hsien (TW); Tean-Sen Jen, Tauyuan Hsien (TW); Deuk-Su Lee, Tauyuan Hsien (TW)

(73) Assignee: Hannstar Display Corporation, Taipei (TW)

( * ) Notice: Subject to any disclaimer, the term of this patent is extended or adjusted under 35 U.S.C. 154(b) by 0 days.

(21) Appl. No.: 09/990,994

(22) Filed: Nov. 13, 2001

(65) Prior Publication Data

US 2003/0020067 A1 Jan. 30, 2003

(30) Foreign Application Priority Data

Jul. 25, 2001 (TW) ........................................ 90118123 A

(51) Int. Cl.[7] ........................ H01L 29/04; G02F 1/1343
(52) U.S. Cl. ............................. 257/72; 257/59; 349/38; 349/39; 349/42; 349/54
(58) Field of Search ...................... 257/59, 72; 349/38, 349/39, 42, 43, 54

(56) References Cited

U.S. PATENT DOCUMENTS 5,867,139 A * 2/1999 Tanaka et al. ................ 345/92
6,130,654 A * 10/2000 Hayashi et al. ............... 345/63

* cited by examiner

Primary Examiner—Minh Loan Tran
(74) Attorney, Agent, or Firm—J.C. Patents

(57) ABSTRACT

A structure of the TFT array includes an additional row of pixel electrode coupled to the last scanning line for the last pixel electrode row. The last pixel electrode row has overlap with the last scanning line to form the equivalent storage capacitor. In addition, the liquid crystal exists on a portion of the pixel electrode row without overlapping with the last scanning line, resulting in the liquid crystal capacitor, which equivalent to the liquid crystal capacitor for the other scanning lines. The pixel electrode row can compensate the miss capacitance from the storage capacitor and the liquid crystal capacitor for the last scanning line. As a result, the difference of capacitive effect for the edge scanning line and the other scanning lines can be balanced, so as to improve the displaying quality.

5 Claims, 9 Drawing Sheets

STRUCTURE OF A THIN FILM TRANSISTOR (TFT) ARRAY

CROSS-REFERENCE TO RELATED APPLICATION

This application claims the priority benefit of Taiwan application serial no. 90118123, filed Jul. 25, 2001.

BACKGROUND OF THE INVENTION

1. Field of Invention

The present invention relates to a structure of a thin film transistor (TFT) array. More particularly, the present invention relates to a TFT array which has a dummy electrode connected to the last scanning line to compensate its capacitance. By the compensation of capacitance, the dummy electrode can get a balance in capacitance for the edge scanning line with the other usual scanning line.

2. Description of Related Art

Due to technologies of semiconductor fabrication and displaying device, the social environment with multimedia manner has also been greatly progressed. From the displaying device point of view, the cathode ray tube (CRT) has its economic advantages and has been widely used in the market of displaying device for the last years. However, if one considers the personal working environment associating with the terminal or display device, or looks at it from environment protection point of view which requires energy saving as a trend, the CRT has its issues about the size, weight, power consumption, and so on. So far, the CRT displaying device seems not able to solve those issues. Therefore, the TFT liquid crystal display (TFT-LCD) device with its advantages of high image quality, space utilizing efficiency, low power consumption, and no irradiation, has gradually been the new trend. The TFT-LCD generally uses liquid crystal that is filled between a substrate of TFT array and a color filter layer to form image pixels. In addition, an upper polarizer and a lower polarizer are formed as the outer layer, whereby an LCD panel is formed. Since the LCD panel by itself cannot produce light, a backlight module is incorporated with the LCD panel, so as to provide a light source for displaying image. The substrate of TFT array usually affects the displaying quality of the TFT-LCD device.

FIG. 1 is a drawing, illustrating the structure of TFT array for a conventional LCD device. FIG. 2 is a cross-sectional view, illustrating the structure of TFT array with respect to FIG. 1. The TFT array is formed on a substrate 100. There are several scanning lines 102a, 102b, 102c . . . and several data lines 104a, 104b, 104c, 104d, 104e, and so on. The adjacent two scanning lines, such as scanning lines 102a, 102b and two adjacent data lines 104a, 104b form an image pixel region. Each pixel region incorporates a TFT 106 and a pixel electrode 108 with respect to the TFT 106. Using the TFT 106 connected to the scanning line 102a as an example for descriptions, each of the TFT 106 has a gate electrode 106a, a source region 106b, and a drain region 106c. The gate electrode 106a of the TFT 106 is electrically connected to the scanning line 102a. The source region 106b of the TFT 106 is electrically connected to the data line 104a. The drain region 106c is electrically connected to the corresponding pixel electrode 108. More over, the pixel electrode 108 covers not only the pixel region but also the adjacent scanning line 102b, so as to form a storage capacitor $C_{st}$ above the scanning line 102b. A similar capacitor $C_{st}$ is also formed at the other scanning line 102c but the scanning line 102a has no capacitor $C_{st}$.

The scanning line 102b has the storage capacitor $C_{st}$. In addition, edge of each pixel electrode 108 corresponding to the scanning line 102b is also couple to the scanning line 102b to form a parasitic capacitor $C_{gs}$, and edge of the pixel electrode 108 is also coupled to the data line 104b to form a parasitic capacitor $C_{sig1}$. The edge of the pixel electrode 108 is also coupled to the data line 104a to form a parasitic capacitor $C_{sig2}$. Thus, the total capacitor $C_{total}$ on the scanning line 102b is the equivalent to the liquid crystal capacitor $C_{LC}$, parasitic capacitors $C_{gs}$, $C_{sig1}$, $C_{sig2}$, coupled in parallel and the storage capacitor $C_{st}$, coupled in cascade.

When data are written into the TFT 106 on the scanning lines 102a, 102b, 102c, the scanning lines 102a, 102b, 102c are sequentially applied with a voltage, so as to set the TFT to a "ON" state under control of the scanning lines 102a, 102b, 102c. Then, the displaying information is written through the data lines 104a–104e into the TFT 106 under control of the scanning lines 102a, 102b, 102c. However, during the data writing-in process, the scanning line 102b and the scanning line 102c (not the edge scanning line) are covered by the adjacent pixel electrode to form the storage capacitor $C_{st}$ and the liquid crystal capacitor $C_{LC}$, but the edge scanning line 103a is not covered by any adjacent pixel electrode. As a result, the capacitive effect of the scanning line 102a is obviously different from that of the other scanning lines 102b, 102c. Due to this difference of capacitive effect between the scanning line 102a and the scanning lines 102b, 102c (not the edge scanning line), the driving condition on the scanning line 102a for the image pixels at the last row is not consistent with the other pixel rows.

FIG. 3A is a circuit configuration, illustrating the capacitor coupling structure for the scanning line other than the edge scanning line associating with the conventional TFT array. In FIG. 3A, the total capacitor $C_{total}$ for the scanning line 102a and the scanning line 102b is equivalent to the liquid crystal capacitor $C_{LC}$, parasitic capacitors $C_{gs}$, $C_{sig1}$, $C_{sig2}$, coupled in parallel and the storage capacitor $C_{st}$, coupled in cascade.

FIG. 3B is a circuit configuration, illustrating the equivalent capacitor for the scanning line other than the edge scanning line, associating with the conventional TFT array. In FIG. 3B, since the parasitic capacitors $C_{gs}$, $C_{sig1}$, $C_{sig2}$ are much smaller than the liquid crystal capacitor $C_{LC}$, the equivalent capacitor after coupling in parallel is about equal to the liquid crystal capacitor $C_{LC}$. Consequently, the total equivalent capacitor $C_{total}$ is equal to the coupling of liquid crystal $C_{LC}$ with the storage capacitor $C_{st}$ in cascade. However, for the structure of the conventional TFT array, since the edge scanning line has not been covered by the adjacent pixel electrode, it has no capacitor of storage capacitor $C_{st}$, parasitic capacitors $C_{gs}$, $C_{sig1}$, $C_{sig2}$, and the liquid crystal $C_{LC}$. Since the capacitive effect is consistent between the edge scanning line 102a and the other scanning lines 102b, 102c, it causes that the displaying condition for the last row of pixel is consistent with the other scanning lines.

SUMMARY OF THE INVENTION

It is an object that the invention provides a structure of the TFT array, which includes a pixel electrode with capacitance compensation formed on the edge scanning line, so as to balance the capacitive effect on the edge scanning line to the other scanning lines.

As embodied and broadly described herein, the invention provides a structure of the TFT array which includes an additional row of pixel electrode coupled to the last scanning line for the last pixel electrode row. The last pixel electrode row has overlap with the last scanning line to form the equivalent storage capacitor. In addition, the liquid crystal exists on a portion of the pixel electrode row without overlapping with the last scanning line, resulting in the liquid crystal capacitor, which equivalent to the liquid crystal capacitor for the other scanning lines. The pixel electrode row can compensate the miss capacitance from the storage capacitor and the liquid crystal capacitor for the last scanning line. As a result, the difference of capacitive effect for the edge scanning line and the other scanning lines can be balanced, so as to improve the displaying quality.

The invention provides another structure of the TFT array which includes an additional row of pixel electrode coupled to the last scanning line for the last pixel electrode row. Moreover, the pixel electrode row is applied with a voltage. By adjusting the overlapping area between the pixel electrode row and the last scanning line, so as to have the equivalent capacitance equal to the total capacitance for the other scanning line. Thus, the displaying quality is effectively improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

EXAMPLE 1

Figure 1:
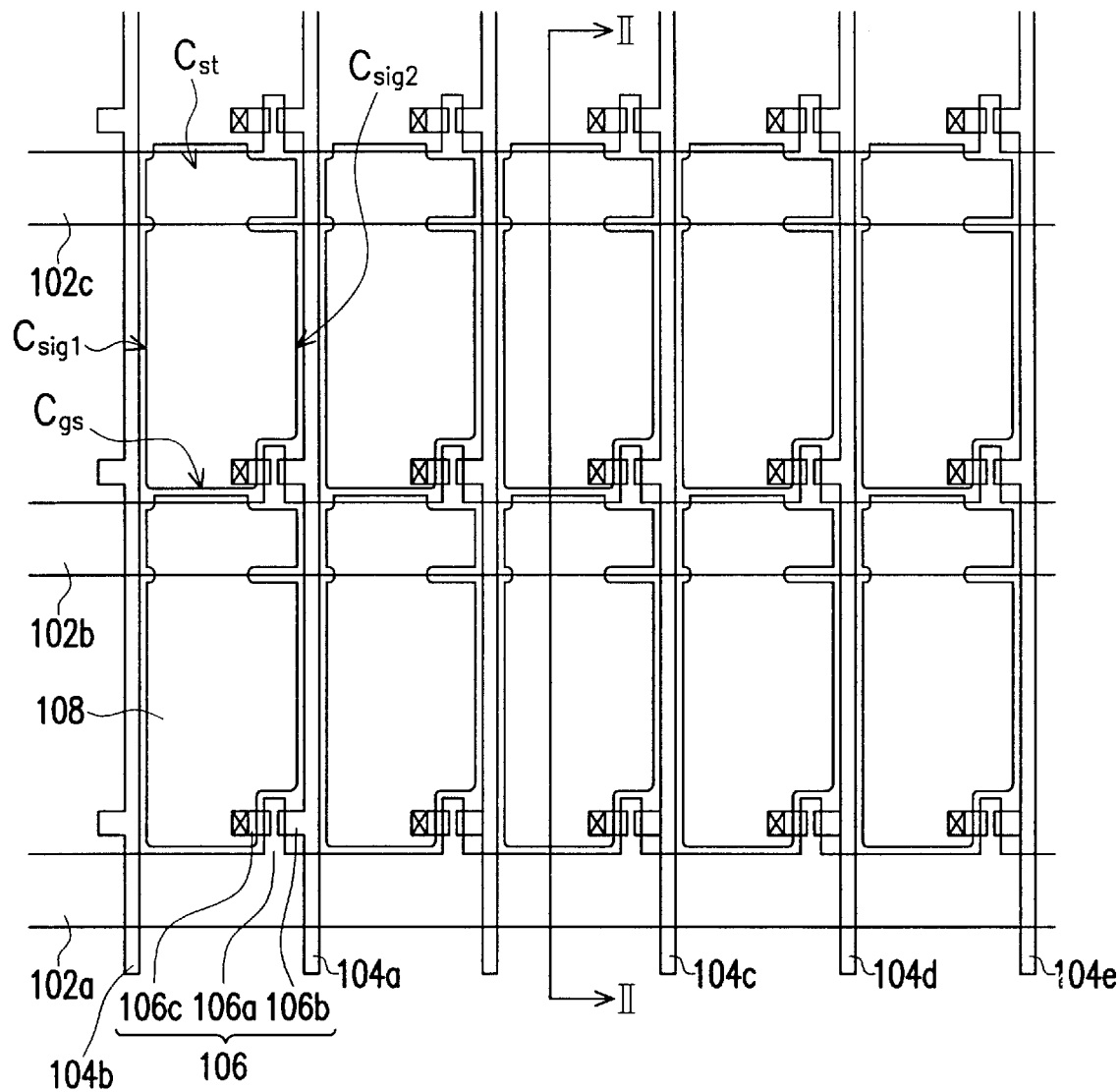
FIG. 1 is a drawing, illustrating the structure of TFT array for a conventional LCD device.
Figure 2:
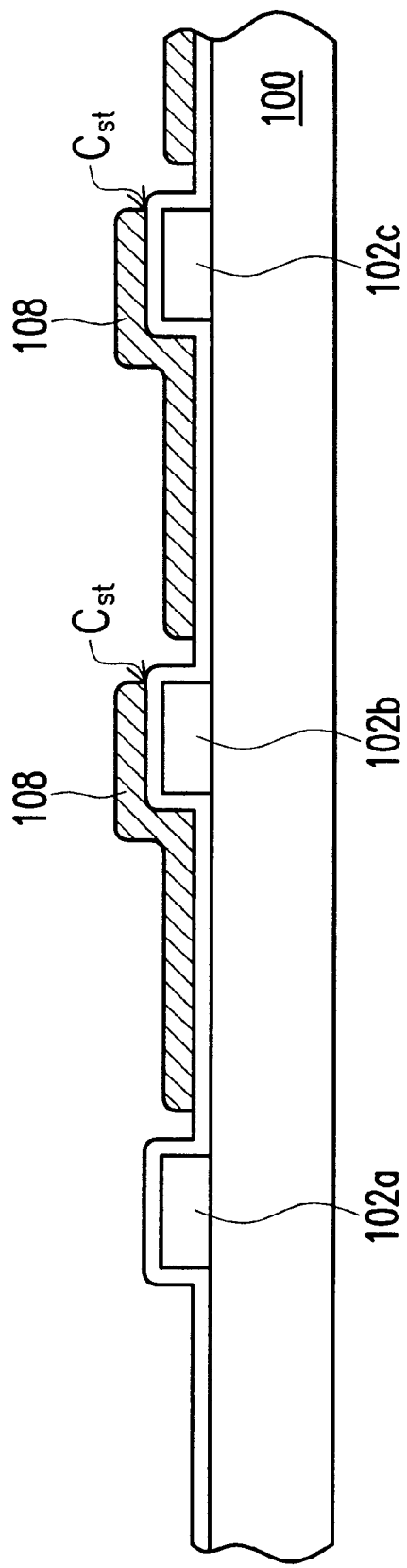
FIG. 2 is a cross-sectional view, illustrating the structure of TFT array with respect to FIG. 1.
Figure 3A:
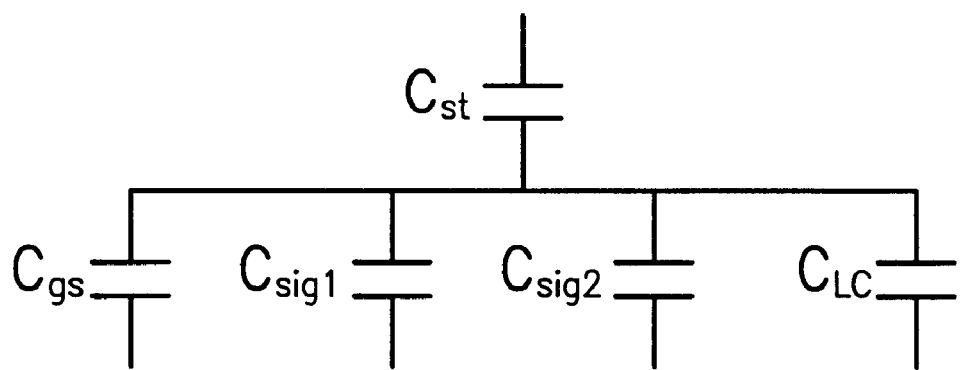
FIG. 3A is a circuit configuration, illustrating the capacitor coupling structure for the scanning line other than the edge scanning line associating with the conventional TFT array.
Figure 3B:
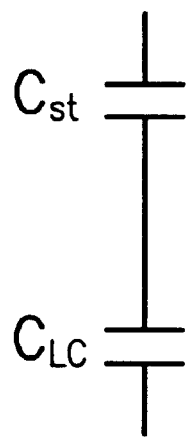
FIG. 3B is a circuit configuration, illustrating the equivalent capacitor for the scanning line other than the edge scanning line, associating with the conventional TFT array.
Figure 4:
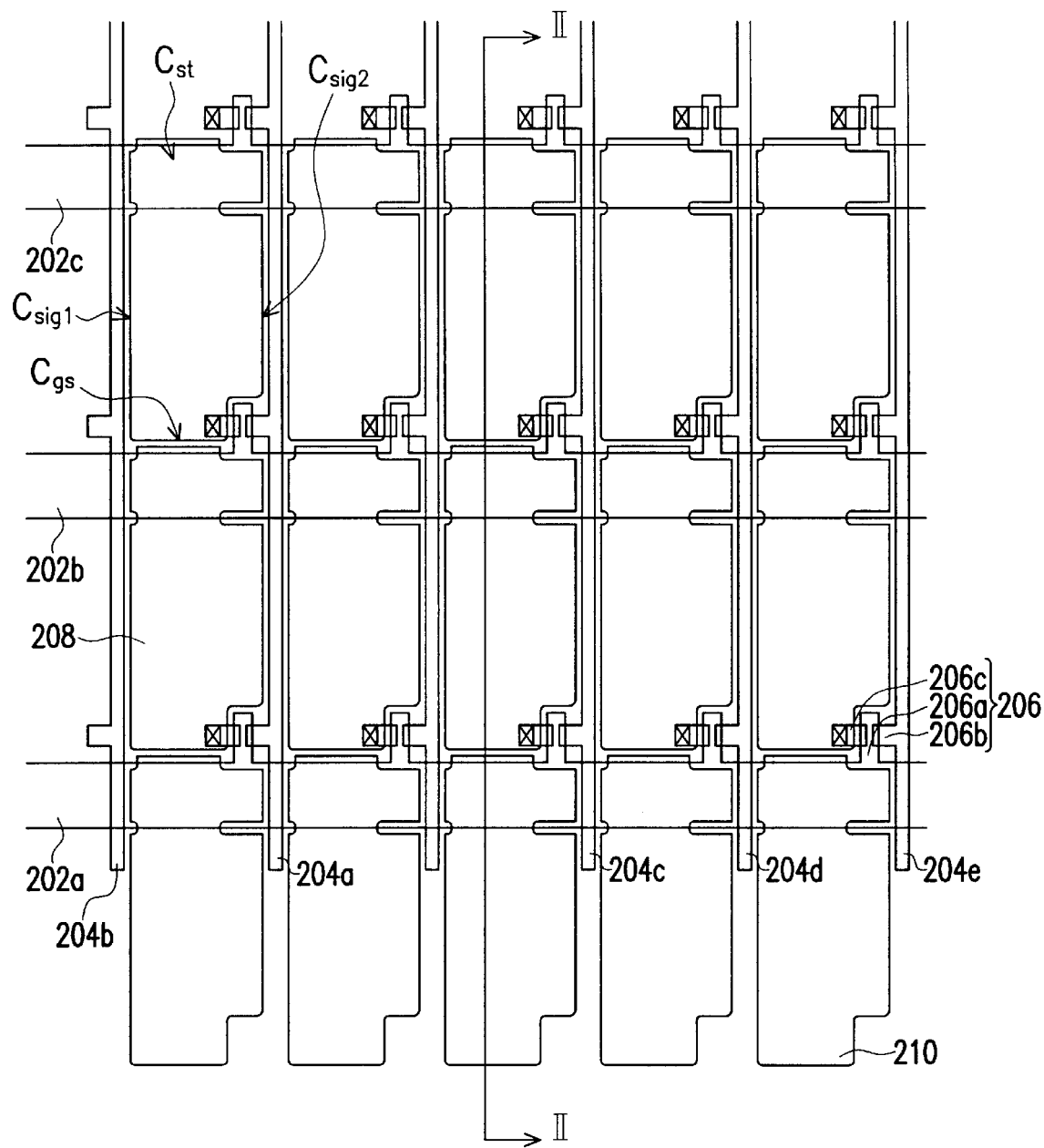
FIG. 4 is a top view, schematically illustrating a structure of TFT array for a LCD device, according to a first preferred embodiment of this invention.
Figure 5:
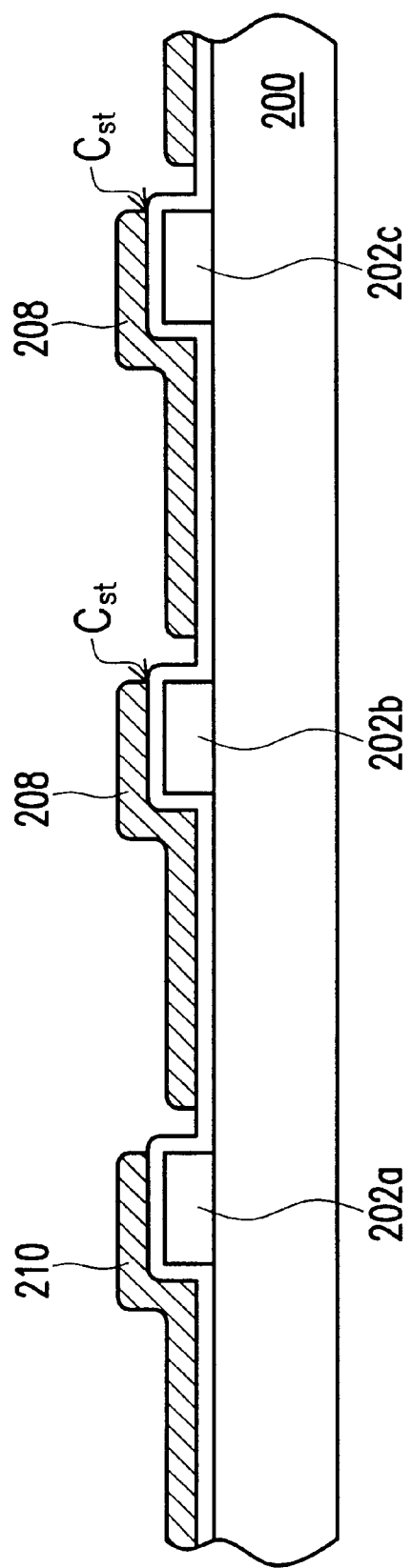
FIG. 5 is a cross-sectional view, schematically illustrating the structure of TFT array with respect to FIG. 4, according to the first preferred embodiment of this invention.

FIG. 4 is a top view, schematically illustrating a structure of TFT array for a LCD device, according to a first preferred embodiment of this invention. FIG. 5 is a cross-sectional view, schematically illustrating the structure of TFT array with respect to FIG. 4. In FIGS. 4 and 5, a layout structure of the TFT array is formed on a substrate 200. The substrate 200 is implemented with, for example, several scanning lines 202a 202c and several data lines 204a–204e. The adjacent two scanning lines, such as scanning lines 202a, 202b and two adjacent data lines 204a, 204b form an image pixel region. Each pixel region incorporates a TFT 206 and a pixel electrode 208 with respect to the TFT 206. In addition, several pixel electrodes 210 are formed beside the scanning line 202a, so as to compensate the capacitive effect on the scanning line 202a.

Using the TFT 206 connected to the scanning line 202a as an example for descriptions, each of the TFT 206 has a gate electrode 206a, a source region 206b, and a drain region 206c. The gate electrode 206a of the TFT 206 is electrically connected to the scanning line 202a. The source region 206b of the TFT 206 is electrically connected to the data line 204a. The drain region 206c is electrically connected to the corresponding pixel electrode 208. More over, the pixel electrode 208 covers not only the pixel region but also the adjacent scanning line 202b, so as to form a storage capacitor $C_{st}$ above the scanning line 202b. Likewise, a similar capacitor $C_{st}$ is also formed on the scanning line 202c. There is no capacitor $C_{st}$ existing on the scanning line 202a.

The scanning line 202b has the storage capacitor $C_{st}$. In addition, edge of each pixel electrode 208 corresponding to the scanning line 202b is also couple to the scanning line 202b to form a parasitic capacitor $C_{gs}$, and a portion of edge of the pixel electrode 208 is also coupled to the data line 204b to form a parasitic capacitor $C_{sig1}$. The edge of the pixel electrode 208 is also coupled to the data line 204a to form a parasitic capacitor $C_{sig2}$. Thus, the total capacitor $C_{total}$ on the scanning line 202b is the equivalent to the liquid crystal capacitor $C_{LC}$, parasitic capacitors $C_{gs}$, $C_{sig1}$, $C_{sig2}$, coupled in parallel and the storage capacitor $C_{st}$, coupled in cascade.

Since the scanning line 202a has no storage capacitor $C_{st}$ and the liquid crystal capacitor $C_{LC}$, several dummy pixel electrodes 210 are disposed beside the scanning line 202a, so as to compensate the storage capacitor $C_{st}$ above the scanning line 202a and the liquid crystal capacitor $C_{LC}$. The dummy pixel electrode 210 has a portion overlapping with the scanning line 202a, so as to create a capacitor equivalent to the storage capacitor $C_{st}$ for the other scanning lines 202b, 202c. The dummy electrode 208 has the other portion without overlapping with the scanning line 202a has liquid crystal above, so that a liquid crystal capacitor $C_{LC}$ exits. After compensation from the dummy pixel electrode 210, the capacitance above the scanning line 212a is therefore about equal to the capacitance of the storage capacitor $C_{st}$ and the liquid crystal capacitor $C_{LC}$ coupled in cascade.

In the invention, when data are written into the TFT 206 on the scanning lines 202a, 202b, 202c, the scanning lines 202a, 202b, 202c are sequentially applied with a voltage, so as to set the TFT 206 to an "ON" state under control of the scanning lines 202a, 202b, 202c. Then, the displaying information is written through the data lines 204a–204e into the TFT 206 under control of the scanning lines 202a, 202b, 202c. During the data writing-in process, the scanning line 202b and the scanning line 202c are covered by the adjacent pixel electrode to form the storage capacitor $C_{st}$ and the liquid crystal capacitor $C_{LC}$ coupled in cascade. Moreover, the edge scanning line is covered by the dummy pixel electrode 210 from above, so as to provide a storage capacitor $C_{st}$ and a liquid crystal capacitor $C_{LC}$. As a result, the capacitive effect on the scanning line 202a is consistent with the capacitive effect on the other scanning lines 202b, 202c.

Figure 6:
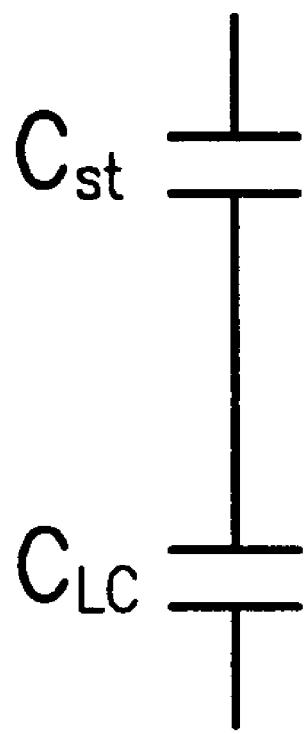
FIG. 6 is a circuit configuration, schematically illustrating an equivalent capacitor coupling structure for the edge scanning line, according to the first preferred embodiment of this invention.

FIG. 6, is a circuit configuration, schematically illustrating an equivalent capacitor coupling structure for the edge scanning line, according to the first preferred embodiment of this invention. In FIG. 6, the total capacitor $C_{total}$ above the scanning line 202b and the scanning line 202c is equivalent to the liquid crystal capacitor $C_{LC}$, the parasitic capacitors $C_{gs}$, $C_{sig1}$, $C_{sig2}$, coupled in parallel and the storage capacitor $C_{st}$, coupled in cascade. Since the capacitance of the parasitic capacitors $C_{gs}$, $C_{sig1}$, $C_{sig2}$ on the scanning lines 202b, 202c is much smaller than the liquid crystal capacitor $C_{LC}$, the capacitance of the liquid crystal capacitor $C_{LC}$ and the parasitic capacitors $C_{gs}$, $C_{sig1}$, $C_{sig2}$ coupled in parallel is about equal to the capacitance of the liquid crystal capacitor $C_{LC}$. Thus, the capacitance of the total capacitor $C_{total}$ on the scanning lines 202b, 202c is about equal to the storage capacitor CS and the liquid crystal capacitor $C_{LC}$ coupled in cascade.

The invention uses the dummy pixel electrode 210, as shown in FIG. 4, to obtain a capacitance equivalent to the storage capacitor $C_{st}$ and the liquid crystal capacitor $C_{LC}$ coupled in cascade, so that the capacitive effect on the scanning line 202a is consistent with the other scanning lines 202b, 202c.

EXAMPLE 2

Figure 7:
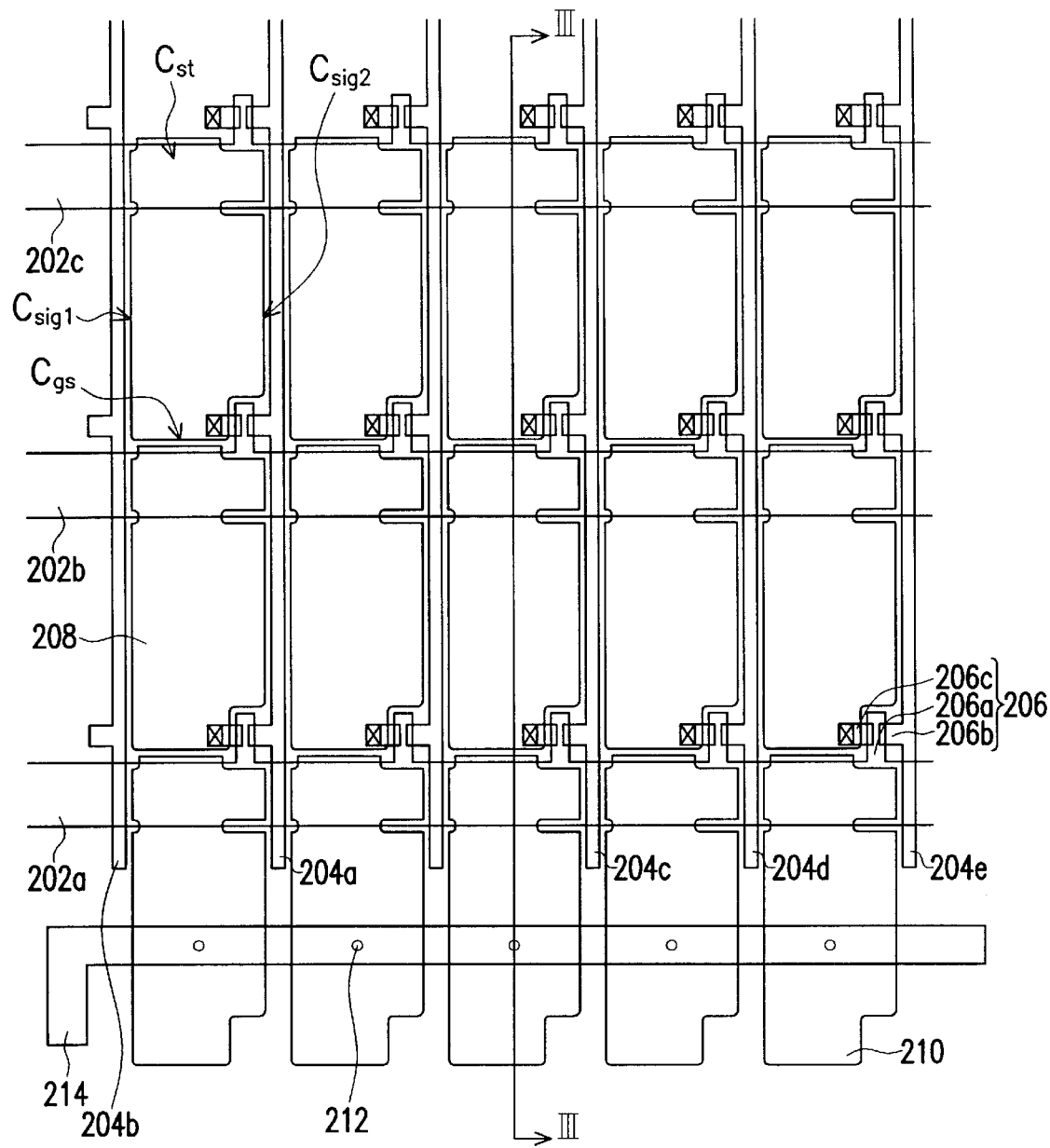
FIG. 7 is a top view, schematically illustrating a structure of TFT array for a LCD device, according to a second preferred embodiment of this invention.
Figure 8:
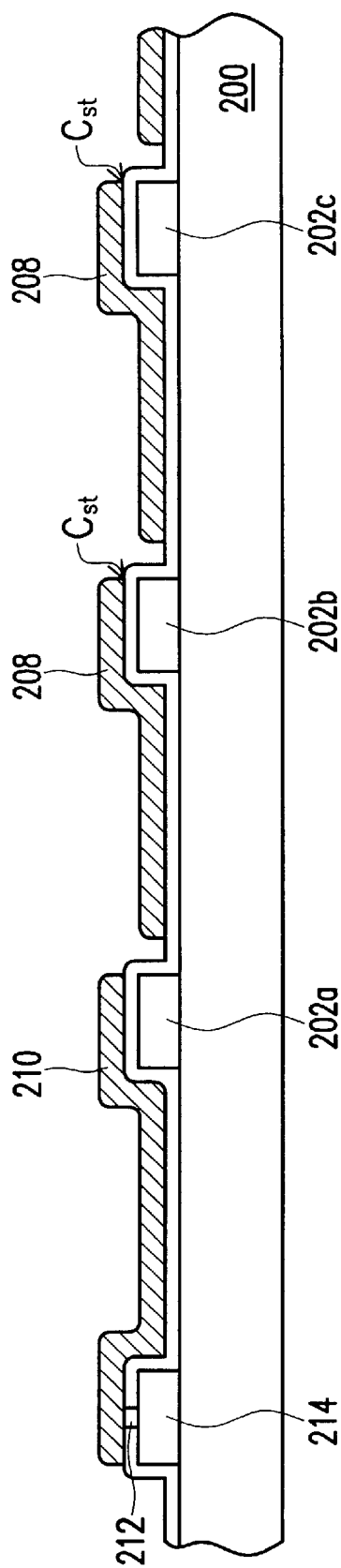
FIG. 8 is a cross-sectional view, schematically illustrating the structure of TFT array with respect to FIG. 7, according to the second preferred embodiment of this invention.

FIG. 7 is a top view, schematically illustrating a structure of TFT array for a LCD device, according to a second preferred embodiment of this invention. FIG. 8 is a cross-sectional view, schematically illustrating the structure of TFT array with respect to FIG. 7. In FIGS. 7 and 8, a layout structure of the TFT array is formed on a substrate 200. The substrate 200 is implemented with, for example, several scanning lines 202a–202c and several data lines 204a–204e. The adjacent two scanning lines, such as scanning lines 202a, 202b and two adjacent data lines 204a, 204b form an image pixel region. Each pixel region incorporates a TFT 206 and a pixel electrode 208 with respect to the TFT 206. In addition, several pixel electrodes 210 are formed beside the scanning line 202a, so as to compensate the capacitive effect on the scanning line 202a.

Using the TFT 206 connected to the scanning line 202a as an example for descriptions, each of the TFT 206 has a gate electrode 206a, a source region 206b, and a drain region 206c. The gate electrode 206a of the TFT 206 is electrically connected to the scanning line 202a. The source region 206b of the TFT 206 is electrically connected to the data line 204a. The drain region 206c is electrically connected to the corresponding pixel electrode 208. More over, the pixel electrode 208 covers not only the pixel region but also the adjacent scanning line 202b, so as to form a storage capacitor $C_{st}$ above the scanning line 202b. Likewise, a similar capacitor $C_{st}$ is also formed on the scanning line 202c. There is no capacitor $C_{st}$ existing on the scanning line 202a.

The scanning line 202b has the storage capacitor $C_{st}$. In addition, edge of each pixel electrode 208 corresponding to the scanning line 202b is also couple to the scanning line 202b to form a parasitic capacitor $C_{gs}$, and a portion of edge of the pixel electrode 208 is also coupled to the data line 204b to form a parasitic capacitor $C_{sig1}$. The edge of the pixel electrode 208 is also coupled to the data line 204a to form a parasitic capacitor $C_{sig2}$. Thus, the total capacitor $C_{total}$ on the scanning line 202b is the equivalent to the liquid crystal capacitor $C_{LC}$, parasitic capacitors $C_{gs}$, $C_{sig1}$, $C_{sig2}$, coupled in parallel and the storage capacitor $C_{st}$, coupled in cascade.

Since the scanning line 202a has no storage capacitor $C_{st}$ and the liquid crystal capacitor $C_{LC}$, several dummy pixel electrodes 210 are disposed beside the scanning line 202a, and each of the dummy pixel electrodes 210 is connected to a common line 214 through the via plugs 212. The via plug 212 has a first end 212a and a second end 212b. The first end 212a of the plug 212, for example, is electrically coupled to the dummy pixel electrode 210. And the second end 212b of the via plug 212, for example, is electrically coupled to the common line 214. The common line is electrically coupled to a common voltage, such as a pad of a driving chip. By adjusting the overlapping area between the dummy pixel electrode 210 and the scanning line 202a, a capacitor kCst can be created between the pixel electrode 210 and the scanning line 202a, and is equivalent to the total capacitor of the storage capacitor $C_{st}$ and the liquid crystal capacitor $C_{LC}$ coupled in cascade on the scanning lines 202b, 202c.

In the invention, when data are written into the TFT 206 on the scanning lines 202a, 202b, 202c, the scanning lines 202a, 202b, 202c are sequentially applied with a voltage, so as to set the TFT 206 to an "ON" state under control of the scanning lines 202a, 202b, 202c. Then, the displaying information is written through the data lines 204a–204e into the TFT 206 under control of the scanning lines 202a, 202b, 202c. During the data writing-in process, the scanning line 202b and the scanning line 202c are covered by the adjacent pixel electrode to form the storage capacitor Cst and the liquid crystal capacitor $C_{LC}$ coupled in cascade. Moreover, the edge scanning line is covered by the dummy pixel electrode 210 which is also connected to a common voltage, so as to provide an equivalent capacitor kCst for the storage capacitor $C_{st}$ and the liquid crystal capacitor $C_{LC}$, coupled in cascade As a result, the capacitive effect on the scanning line 202a is consistent with the capacitive effect on the other scanning lines 202b, 202c.

Figure 9:
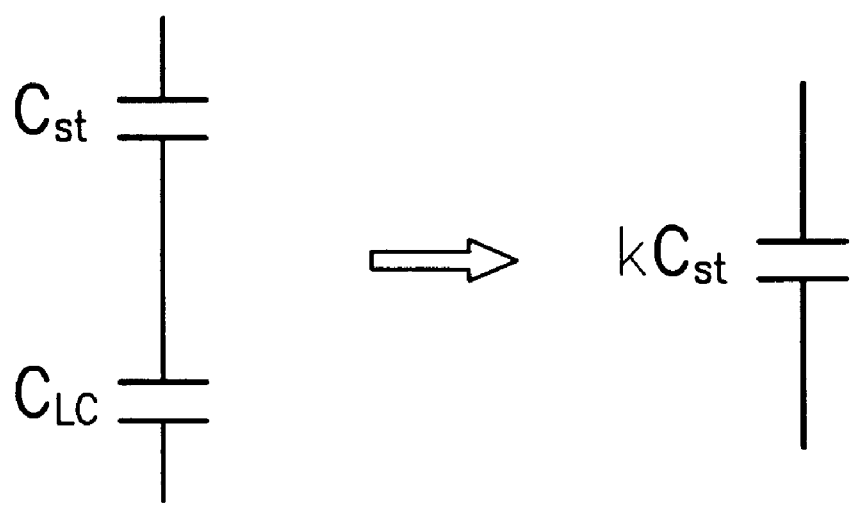
FIG. 9 is a circuit configuration, schematically illustrating an equivalent capacitor coupling structure for the edge scanning line, according to the second preferred embodiment of this invention.

FIG. 9 is a circuit configuration, schematically illustrating an equivalent capacitor coupling structure for the edge scanning line, according to the second preferred embodiment of this invention. In FIG. 9, the total capacitor $C_{total}$ above the scanning line 202b and the scanning line 202c is equivalent to the liquid crystal capacitor $C_{LC}$, the parasitic capacitors $C_{gs}$, $C_{sig1}$, $C_{sig2}$, coupled in parallel and the storage capacitor $C_{st}$, coupled in cascade. Since the capacitance of the parasitic capacitors $C_{gs}$, $C_{sig1}$, $C_{sig2}$ on the scanning line 202b, 202c is much smaller than the liquid crystal capacitor $C_{LC}$, the capacitance of the liquid crystal capacitor $C_{LC}$ and the parasitic capacitors $C_{gs}$, $C_{sig1}$, $C_{sig2}$ coupled in parallel is about equal to the capacitance of the liquid crystal capacitor $C_{LC}$. Thus, the capacitance of the total capacitor $C_{total}$ on the scanning lines 202b, 202c is about equal to the storage capacitor $C_{st}$ and the liquid crystal capacitor $C_{LC}$ coupled in cascade.

The invention uses the dummy pixel electrode 210, as shown in FIG. 7, to obtain a capacitor $kC_{st}$ equivalent to the storage capacitor $C_{st}$ and the liquid crystal capacitor $C_{LC}$ coupled in cascade, so that the capacitive effect on the scanning line 202a is consistent with the other scanning lines 202b, 202c.

In summary, the TFT array structure of the invention has several advantages as follows:

1. In the TFT array structure of the invention, the capacitive effect for the last scanning line is consistent with the capacitive effect for the other scanning lines, whereby the edge pixel row has the same displaying condition with the other pixels.

2. In the TFT array structure of the invention can be fabricated under the same fabrication process but only changing the pattern of the photomask when the pixel electrodes are patterned. As a result, the capacitive effect for the last scanning line can be balanced to the capacitive effect for the other scanning lines It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A structure of TFT array on a substrate, the structure comprising:

a substrate, the substrate has a side;

a plurality of pixels, each of the pixels including a thin film transistor (TFT), a pixel electrode, a scanning line, and a data line, wherein the TFT includes a gate electrode, a source region, and a drain region, the gate electrode coupled to the scanning line, the source region coupled to the data line, the drain region coupled to the pixel electrode, and the pixel electrode has an overlapping portion with the adjacent scanning lines along the side of the substrate;

a plurality of dummy electrodes, each of the dummy electrodes has a portion overlapping with the scanning lines near to the side of the substrate; and at least one plug and a common line below each of the dummy electrodes, and the dummy electrodes are coupled to the common line through the plug.

2. The structure of claim 1, wherein the dummy electrodes and the pixel electrodes have the same pattern.

3. The structure of claim 1, wherein the common line is connected to a voltage.

4. A structure of TFT array on a substrate, the structure comprising:

a substrate, the substrate has a side;

a plurality of pixels, each of the pixels including a thin film transistor (TFT), a pixel electrode, a scanning line, and a data line, wherein the TIFT includes a gate electrode, a source region, and a drain region, the gate electrode coupled to the scanning line, the source region coupled to the data line, the drain region coupled to the pixel electrode, and the pixel electrode has an overlapping portion with the adjacent scanning lines along the side of the substrate;

a plurality of dummy electrodes, each of the dummy electrodes has a portion overlapping with the scanning lines near to the side of the substrate;

a plurality of plugs disposed under the dummy electrodes, each of the plugs has a first end and a second end, and the first end is electrically connected to one of the dummy electrode; and a common line disposed below the dummy electrodes, and electrically connected to the second end of the plug.

5. The structure of claim 4, wherein the dummy electrodes and the pixel electrodes have the same pattern.

* * * * *